United States Patent
Chae et al.

(10) Patent No.: US 8,932,934 B2
(45) Date of Patent: Jan. 13, 2015

(54) METHODS OF SELF-FORMING BARRIER INTEGRATION WITH PORE STUFFED ULK MATERIAL

(71) Applicant: GlobalFoundries Inc., Grand Cayman (KY)

(72) Inventors: Moosung M. Chae, Englewood Cliffs, NJ (US); Errol Todd Ryan, Clifton Park, NY (US); Nicholas Vincent Licausi, Watervliet, NY (US); Christian Witt, Woodbridge, CT (US); Ailian Zhao, Slingerlands, NY (US); Ming He, Slingerlands, NY (US); Sean X. Lin, Watervliet, NY (US); Xunyuan Zhang, Albany, NY (US); Kunaljeet Tanwar, Slingerlands, NY (US)

(73) Assignee: Global Foundries Inc., Grand Cayman (KY)

( * ) Notice: Subject to any disclaimer, the term of this patent is extended or adjusted under 35 U.S.C. 154(b) by 70 days.

(21) Appl. No.: 13/903,283

(22) Filed: May 28, 2013

(65) Prior Publication Data

US 2014/0353835 A1 Dec. 4, 2014

(51) Int. Cl.

| | |
|---|---|
| H01L 21/76 | (2006.01) |
| H01L 21/768 | (2006.01) |
| H01L 23/48 | (2006.01) |
| H01L 21/316 | (2006.01) |
| H01L 21/02 | (2006.01) |

(52) U.S. Cl.
CPC .... *H01L 21/76814* (2013.01); *H01L 21/76843* (2013.01); *H01L 21/76877* (2013.01); *H01L 23/48* (2013.01); *H01L 21/31695* (2013.01); *H01L 21/7682* (2013.01); *H01L 21/02203* (2013.01); *H01L 21/76831* (2013.01)
USPC .......................................... 438/422; 438/407

(58) Field of Classification Search
CPC .............. H01L 21/7682; H01L 21/02203; H01L 21/76831; H01L 21/31695
USPC .................................................. 438/407, 422
See application file for complete search history.

(56) References Cited

U.S. PATENT DOCUMENTS

| | | | | |
|---|---|---|---|---|
| 6,365,506 | B1 * | 4/2002 | Chang et al. | 438/624 |
| 6,528,409 | B1 * | 3/2003 | Lopatin et al. | 438/618 |
| 6,537,896 | B1 * | 3/2003 | Catabay et al. | 438/474 |
| 6,723,653 | B1 * | 4/2004 | Kim | 438/723 |
| 7,091,618 | B2 * | 8/2006 | Yoshizawa et al. | 257/774 |
| 7,166,531 | B1 * | 1/2007 | van den Hoek et al. | 438/623 |
| 7,271,089 | B2 * | 9/2007 | Sandu et al. | 438/638 |
| 7,538,028 | B2 * | 5/2009 | Sandu et al. | 438/638 |
| 7,588,995 | B2 * | 9/2009 | Yu et al. | 438/409 |

(Continued)

OTHER PUBLICATIONS

Frot et al., "Application of the Protection/Deprotection Strategy to the Science of Porous Materials", Adv. Mater. 2011, 23, pp. 2828-2832.

*Primary Examiner* — Nicholas Tobergte
(74) *Attorney, Agent, or Firm* — Heslin Rothenberg Farley & Mesiti P.C.

(57) ABSTRACT

A process is provided for methods of reducing contamination of the self-forming barrier of an ultra-low k layer during semiconductor fabrication. In one aspect, a method includes: providing a cured ultra-low k film which contains at least one trench, and the pores of the film are filled with a pore-stuffing material; removing exposed pore-stuffing material at the surface of the trench to form exposed pores; and forming a self-forming barrier layer on the surface of the trench.

13 Claims, 3 Drawing Sheets

(56) References Cited

U.S. PATENT DOCUMENTS

| | | | |
|---|---|---|---|
| 7,602,061 B2* | 10/2009 | Kagawa et al. | 257/734 |
| 7,842,518 B2* | 11/2010 | Miyajima | 438/4 |
| 7,968,451 B2* | 6/2011 | Ko et al. | 438/627 |
| 8,445,382 B2* | 5/2013 | Besling | 438/687 |
| 2009/0104774 A1* | 4/2009 | Furukawa et al. | 438/680 |

* cited by examiner

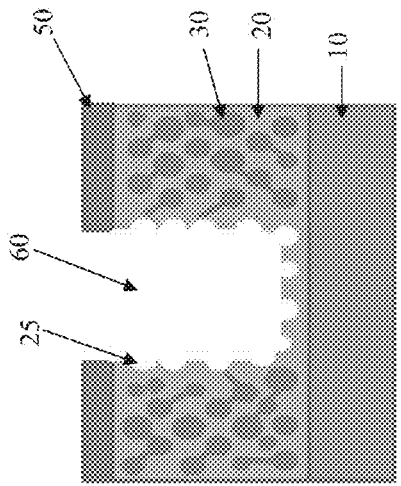
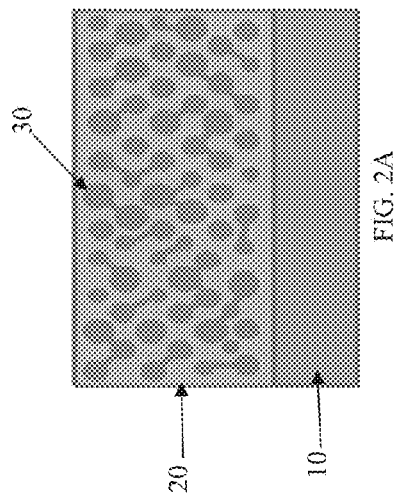
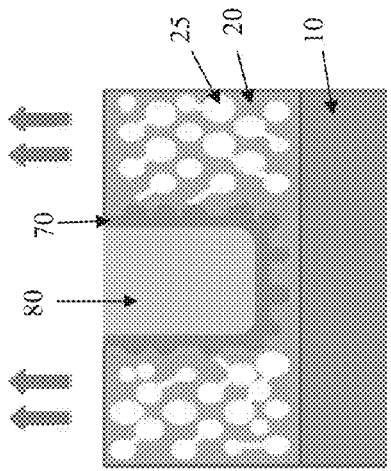
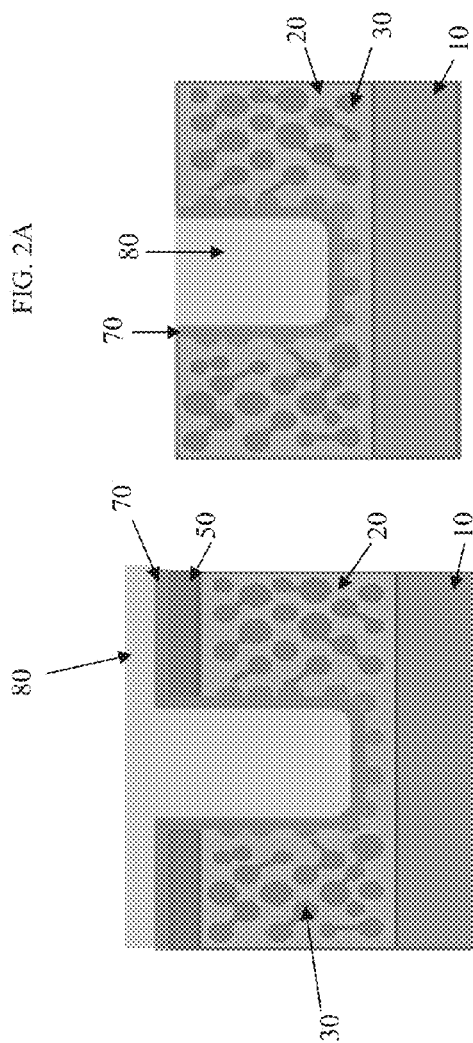

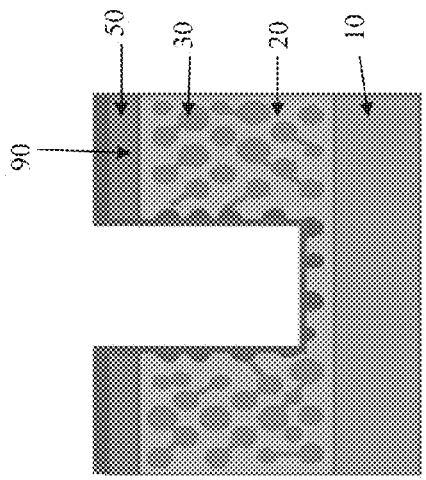
FIG. 3A
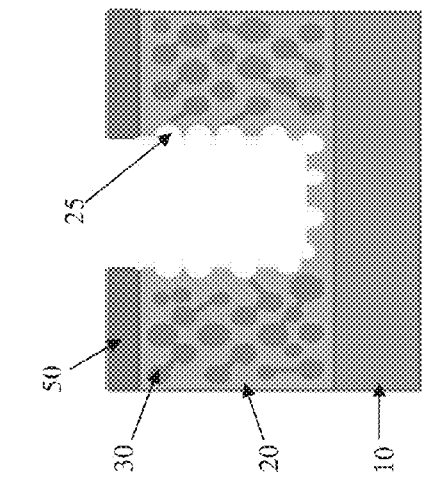
FIG. 3B
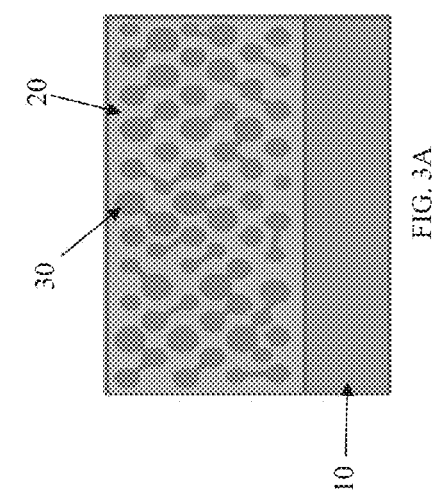
FIG. 3C
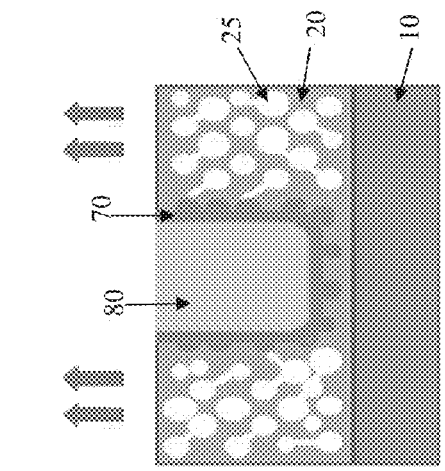
FIG. 3D
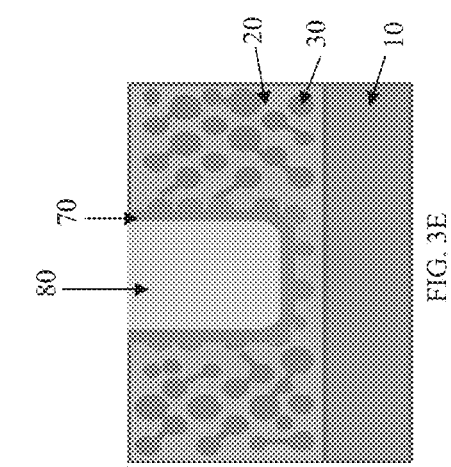
FIG. 3E
FIG. 3F

METHODS OF SELF-FORMING BARRIER INTEGRATION WITH PORE STUFFED ULK MATERIAL

FIELD OF THE INVENTION

The present invention generally relates to semiconductor devices and methods of fabricating semiconductor devices, and more particularly, to methods of reducing contamination of the self-forming barrier of an ultra-low k layer during fabrication.

BACKGROUND OF THE INVENTION

Ultra-low k (ULK) dielectric materials possess many properties desired in semiconductors. For instance, a layer, or film, of ultra-low k dielectric material may contain pores within the layer that help to reduce the capacitance of the semiconductor. However, the presence of these pores also necessarily decreases the strength of the film, resulting in a decrease in the film's stability during the semiconductor patterning process. The more pores present in the film, the greater the resulting damage to the ultra-low k dielectric material during processing.

Existing techniques for strengthening the ultra-low k layer include stuffing the pores in the layer with a substance during the subsequent processing steps. Frot et al. (*Adv. Mater.* 2011, 23, 2828-2832) describe filling the pores of an ultra-low k layer with an organic polymer, then subsequently removing the organic polymer, to mitigate the effects of patterning and other downstream processing steps. A pore-stuffed ultra-low k layer can be used for protection of the ultra-low k layer from reactive ion etching and for the prevention of precursor penetration in subsequent chemical vapor deposition (CVD) or atomic layer deposition (ALD) liner processes. The strengthened layer also could provide more process margin during the chemical-mechanical planarization (CMP) process.

Substances such as manganese react with dielectrics, such as those found in an ultra-low k film, to form a self-forming barrier (SFB). This integration of the self-forming barrier and the dielectric material is important for RC reduction. However, when the pores are stuffed, as described above, there are concerns about the integration of the self-forming barrier with the pore-stuffing material in the ultra-low k layer, rather than with the dielectric material. A reaction between the pore-stuffed material (that is, due to unexposed dielectric layer in the trench or via) and the self-forming barrier could lead to contamination of the self-forming barrier, resulting in the potential for the formation of a discontinuous self-forming barrier layer. Accordingly, a method is needed to provide for a continuous dielectric layer in a pore-stuffed ultra-low k layer.

BRIEF SUMMARY

The shortcomings of the prior art are overcome and advantages are provided through the provision, in one aspect, of a method which includes providing a cured ultra-low k film containing pores filled with a pore-stuffing material. This ultra-low k film has at least one trench. The pore-stuffing material that is exposed at the surface of the trench is then removed to form exposed pores. A self-forming barrier layer is then formed on the surface of the trench.

In another aspect, an intermediate semiconductor device structure is provided. The intermediate semiconductor device structure contains a dielectric layer with pores. A trench is contained within the dielectric layer. The pores exposed at the surface of the trench are not filled with a pore-stuffing material, while the pores not exposed at the surface of the trench, that is, the internal pores, are filled with a pore-stuffing material. A self-forming barrier is present on the surface of the trench.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIGS. 2A to 2E depict one embodiment of a process for reducing contamination of a self-forming barrier, in accordance with one or more aspects of the present invention.

FIGS. 3A to 3F depict one embodiment of a process for reducing contamination and increasing the uniformity of a self-forming barrier, in accordance with one or more aspects of the present invention.

DETAILED DESCRIPTION

Figure 1:
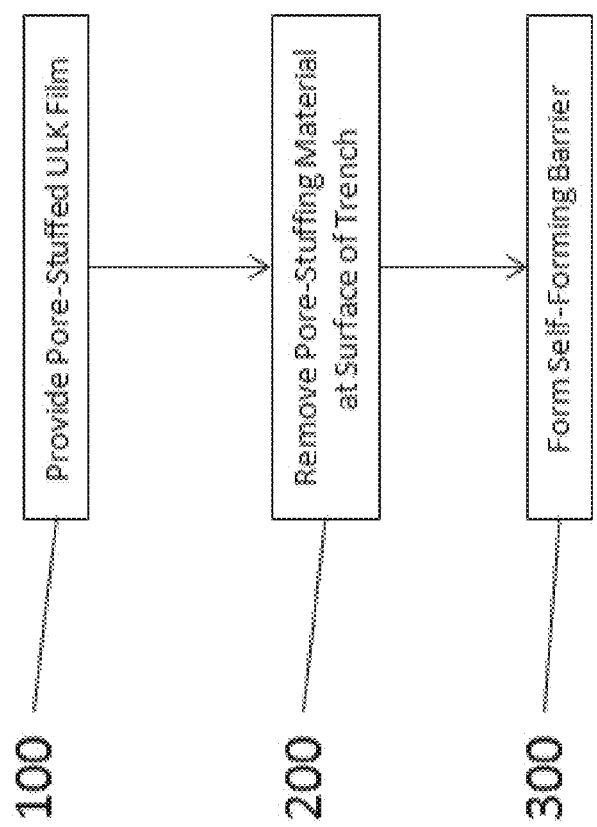
FIG. 1 depicts an embodiment of a process for reducing contamination of a self-forming barrier, in accordance with one or more aspects of the present invention.

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure.

Reference is made below to the drawings, which are not drawn to scale for ease of understanding, wherein the same reference numbers used throughout different figures designate the same or similar components.

Generally stated, disclosed herein is a method of reducing contamination of the self-forming barrier of an ultra-low k layer with pore stuffed material during fabrication. The method includes, in one aspect, providing a cured ultra-low k film which has pores filled with a pore-stuffing material and at least one trench. The pore-stuffing material that is exposed at the surface of the trench is removed, and a self-forming barrier layer is formed on the surface of the trench. The removal of the pore-stuffing material allows the self-forming barrier material to react with the fully exposed dielectric material (the ultra-low k material). This method serves to provide for a continuous dielectric layer in a pore-stuffed ultra-low k layer.

FIG. 1 depicts a process overview of one embodiment of the process. As shown in FIG. 1, the process starts with obtaining an ultra-low k film that contains pores filled with a pore-stuffing material 100. The person of skill will understand that "filled" does not necessarily mean that the entirety of every pore is completely packed with the pore-stuffing material. However, it should be noted that the pore filling should be as homogenous as possible throughout the ultra-low k film to prevent the formation of weak regions. The ultra-low k film may be made of any porous ultra-low k material. Specifically, the ultra-low k material should be compatible with the material used for the formation of the self-forming barrier. Non-limiting examples of these films include spin-on organosilicate glass materials, such as sol-gel films like Nanoglass, and methylsilsesquioxane materials such as JSR LKD-5109. Examples of porous ultra-low k materials deposited by plasma-enhanced chemical vapor deposition (PECVD) include Novellus Coral and Applied Material's Black Diamond. As a non-limiting example, the ultra-low k material may be pSiCOH. The material will typically have a k-value of less than or equal to 3. The porous material may have pores ranging in size from 0.2-3 nm in diameter. The ultra-low k material will typically range in thickness from 25 to 200 nm.

Pore-stuffing material suitable for ultra-low k film pore stuffing should be compatible with the ultra-low k film material and able to withstand the temperatures and pressures used during processing, including the addition and removal of the hardmask, patterning of the ultra-low k layer, addition of a liner in a trench, and/or chemical mechanical planarization. Additionally, the pore-stuffing material must be removable by techniques compatible with back end of line (BEOL) conditions. Examples of suitable pore-stuffing material include, but are not limited to, polymers such as polymethylmethacrylate and other acrylates, polystyrene, polypropylene oxide), and poly(ethylene oxide) derivatives.

At least one trench is present in the ultra-low k film. The trench may be formed by reactive ion etching. As described in FIG. 1, the pore-stuffing material located in the pores at the surface of the trench is then removed 200, or recessed. To be perfectly clear, the language "at the surface of", when referring to the removal of the pore-stuffing material, indicates that pore-stuffing material is present at the surface of the trench of the ultra-low k layer, as shown in FIG. 2b. It is advantageous for the pore stuffing material to be removed to a distance of about 1 nm to 2 nm from the surface of the trench. Ideally, no pore stuffing material will be exposed at the surface of the trench. The pore stuffing material may be removed by methods such as, but not limited to, thermal vapor and plasma etching or thermal annealing and wet etch removal. A controlled oxidizing plasma ($O_2$, $CO_2$, CO, etc.) using a remote plasma will give isotropic etching of the organic pore stuffing material. The removal of the pore stuffing material should be done at a temperature lower than the decomposition temperature of the pore stuffing material in order to prevent the inadvertent removal of the remainder of the pore stuffing material contained in the ultra-low k film, that is, the material not found at the surface of the trench. By utilizing lower temperatures, the removal process can be better controlled. The actual temperature to be used for recessing the pores will be determined by the pore stuffing material utilized and will be determined easily by a person of skill.

Once the pore stuffing material is recessed from the surface of the trench, a self-forming barrier can be formed 300. Self-forming barrier material interacts with the ultra-low k dielectric layer to form an insulating barrier that can also act as a moisture blocker. In some embodiments, aluminum may be used as the self-forming barrier material. In other embodiments, manganese may be the self-forming barrier material. In some embodiments, the dielectric layer material is pSiCOH and manganese is the self-forming barrier material. In these instances, the manganese may be deposited by atomic layer deposition or chemical vapor deposition and will react with the fully exposed dielectric to form a continuous $MnSiO_x$ layer, which acts as barrier. If the pore stuffing material is still present upon the deposition of the self-forming barrier material (that is, the manganese), the resulting barrier layer will contain "holes", resulting in a less protective surface. The full formation of the desired phase of the barrier (that is, the reaction between the self-forming barrier material and the ultra-low k dielectric layer) will be unable to take place due to the contamination by the pore stuffing material.

One embodiment for forming a continuous self-forming barrier layer is shown in FIGS. 2A-2E. FIG. 2A shows an ultra-low k film 20 on a substrate 10. The ultra-low k film 20 contains stuffed pores 30 as described herein. A hardmask 50 is deposited and patterned, and the ultra-low k film 20 is patterned to form a trench 60, as shown in FIG. 2B. This patterning may be done by conventional methods and is not discussed here. The pore-stuffing material at the surface of the trench 60 is then recessed into the ultra-low k layer as described above, resulting in unstuffed pores 25 at the surface of the trench 60. A self-forming barrier material is then deposited on the surfaces of the trench 60 and the hardmask 50; this self-forming barrier material will react with the dielectric material of the ultra-low k layer to form a continuous self-forming barrier layer 70. The self-forming barrier material may or may not react with the hardmask 50, depending on the hardmask material. However, because the hardmask is removed in subsequent steps, whether or not these materials react is not relevant to this discussion of the procedure. A copper interconnect 80 is deposited in the trench 60 and on the self-forming barrier layer 70, as illustrated in FIG. 2C. The layers of the self-forming barrier layer 70 and the copper interconnect 80 overburden on top of the hardmask 50 (that is, distal to the substrate 10), as well as the hardmask 50, are then removed, for instance, by chemical mechanical planarization, as shown in FIG. 2D. This hardmask removal and copper deposition may be done by conventional methods which are not discussed in detail here. The pores remain stuffed 30 until after chemical mechanical planarization, allowing for more controlled stoppage of the chemical mechanical planarization on the ultra-low k layer. This results in cleaner line height uniformity, as compared to chemical mechanical planarization on a standard, unstuffed ultra-low k layer. FIG. 2E illustrates the removal 300 (see FIG. 1) of the remainder of the pore-stuffing material from the ultra-low k layer, such that the ultra-low k layer pores are substantially free of pore-stuffing material (unstuffed pores 25). The pore-stuffing material is removed through the surface of the ultra-low k layer 20 but does not escape through the surface of the trench 60, which is protected by the self-forming barrier 70. The removal may be accomplished in a number of ways, including, but not limited to thermal anneal, UV curing, or potentially one of many alternative cures (such as $H_2$ remote plasma, IR layer treatment, and the like).

In some embodiments, it may be desirable to fill the recessed pores with a surface treatment layer after the removal of the pore stuffing material, but prior to the formation of the self-forming barrier. This surface treatment layer provides smooth sidewall roughness, which increases the thickness uniformity of the self-forming barrier. A process overview of one such embodiment is disclosed herein and depicted in FIGS. 3A-3F. FIG. 3A shows an ultra-low k film 20 on a substrate 10. The ultra-low k film 20 contains stuffed pores 30 as described herein. A hardmask 50 is deposited and patterned, and the pore-stuffed ultra-low k film is patterned to form a trench 60, as shown in FIG. 3B. The pore-stuffing material at the surface of the trench 60 is then recessed into the ultra-low k layer as described above, resulting in unstuffed pores 25 at the surface of the trench 60. A surface treatment layer 90 is deposited on the surface of the trench 60 and the hardmask 50, as shown in FIG. 3C. The surface treatment layer 90 may be dielectric materials such as oxides or nitrides. The surface treatment layer 90 will often be a silicon-containing material; exemplary surface treatment layer materials include SiC, SiCN, SiN, $SiO_2$, $SiH_4$ and Si. A self-forming barrier material is then deposited on the surface of the trench 60 and the hardmask 50; this self-forming barrier material will react with the surface treatment layer 90 and the dielectric material of the ultra-low k layer 20 to form a continuous self-forming barrier layer 70 (FIG. 3D). When the surface treatment layer 90 is thin enough, all of the surface treatment layer 90, in addition to the surface layer of the ultra-low k layer 20, will be reacted with the self-forming barrier material to form the self-forming barrier layer 70. If the surface treatment layer 90 is thick, only it, and not the ultra-low k layer 20, will be reacted with the self-forming barrier material to form the self-forming barrier layer 70. A copper interconnect 80 is deposited in the trench 60 and on the self-forming barrier layer 70, as illustrated in FIG. 3D. The layers of the self-forming barrier layer 70 and the copper interconnect 80 overburden on top of the hardmask 50 (that is, distal to the substrate 10), as well as the hardmask 50, are then removed, for instance, by chemical mechanical planarization, as shown in FIG. 3E. FIG. 3F illustrates the removal 300 (see FIG. 1) of the remainder of the pore-stuffing material from the ultra-low k layer, such that the ultra-low k layer pores are substantially free of pore-stuffing material (unstuffed pores 25). The pore stuffing material is removed as discussed supra.

In one aspect, an intermediate semiconductor device structure is also disclosed. This intermediate semiconductor device structure contains a dielectric layer which has pores filled with a pore-stuffing material. A trench is present within the dielectric layer, and a self-forming barrier is present on the surface of the trench.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method, comprising:
providing a cured ultra-low k film comprising at least one trench, wherein pores of said film are filled with a pore-stuffing material;
removing exposed pore-stuffing material at the surface of the trench to form exposed pores; and
forming a self-forming barrier layer on the surface of the trench.

2. The method of claim 1, wherein the exposed pore-stuffing material is removed to a distance of about 2 nm from the surface of the trench.

3. The method of claim 1, further comprising filling exposed pores with a surface treatment layer.

4. The method of claim 3, wherein said surface treatment layer comprises silicon.

5. The method of claim 4, wherein said surface treatment layer comprises SiC, SiCN, SiN, Si, or $SiO_2$.

6. The method of claim 1, further comprising removing the remainder of the pore-stuffing material from the ultra-low k film after the self-forming barrier layer is formed.

7. The method of claim 1, wherein the self-forming barrier material is selected from manganese or aluminum.

8. The method of claim 1, comprising:
providing a cured ultra-low k film, wherein pores of said film are filled with a pore-stuffing material;
forming a trench in the ultra-low k film;
removing exposed pore-stuffing material at the surface of the trench;
forming a self-forming barrier on the surface of the trench;
electroplating;
smoothing said surface of said of said ultra-low k film by chemical-mechanical planarization; and
removing remainder of pore-stuffing material from ultra-low k film.

9. The method of claim 1, comprising:
providing a cured ultra-low k film, wherein pores of said film are filled with a pore-stuffing material;
forming a trench in the ultra-low k film;
removing exposed pore-stuffing material at the surface of the trench;
filling exposed pores with a surface treatment layer;
forming a self-forming barrier on the surface of the trench;
electroplating;
smoothing said surface of said of said ultra-low k film by chemical-mechanical planarization; and
removing remainder of pore-stuffing material from ultra-low k film.

10. The method of claim 8, wherein the pore-stuffing material is removed to a distance of about 2 nm from the surface of the trench.

11. The method of claim 9, wherein the pore-stuffing material is removed to a distance of about 2 nm from the surface of the trench.

12. The method of claim 9, wherein the surface treatment layer comprises SiC, SiCN, SiN, Si, or $SiO_2$.

13. An intermediate semiconductor device structure comprising:
- a dielectric layer comprising pores; and;
- a trench within said dielectric layer;
- wherein the pores exposed at the surface of said trench are not filled with a pore-stuffing material and the pores not exposed at the surface of the trench are filled with a pore-stuffing material; and
- a self-forming barrier on the surface of the trench.

* * * * *